United States Patent
Park et al.

(10) Patent No.: US 8,901,550 B2
(45) Date of Patent: Dec. 2, 2014

(54) ORGANIC LIGHT-EMITTING DISPLAY APPARATUS AND METHOD OF MANUFACTURING THE SAME

(71) Applicants: Se-Hun Park, Yongin (KR); Won-Kyu Lee, Yongin (KR); Yeoung-Jin Chang, Yongin (KR); Jae-Hwan Oh, Yongin (KR); Seong-Hyun Jin, Yongin (KR); Jae-Beom Choi, Yongin (KR)

(72) Inventors: Se-Hun Park, Yongin (KR); Won-Kyu Lee, Yongin (KR); Yeoung-Jin Chang, Yongin (KR); Jae-Hwan Oh, Yongin (KR); Seong-Hyun Jin, Yongin (KR); Jae-Beom Choi, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 0 days.

(21) Appl. No.: 13/938,412

(22) Filed: Jul. 10, 2013

(65) Prior Publication Data

US 2014/0225071 A1    Aug. 14, 2014

(30) Foreign Application Priority Data

Feb. 14, 2013   (KR) ........................ 10-2013-0016056

(51) Int. Cl.
| H01L 35/24 | (2006.01) |
| H01L 51/00 | (2006.01) |
| H01L 51/52 | (2006.01) |
| H01L 51/56 | (2006.01) |

(52) U.S. Cl.
CPC ............ H01L 51/5203 (2013.01); H01L 51/56 (2013.01)

USPC 257/40; 257/72; 257/E39.007; 257/E29.117; 257/E29.273

(58) Field of Classification Search
CPC ......................... H01L 27/1214; H01L 29/4908
USPC ........ 257/40, 59, 72, 347, E39.007, E29.117, 257/E29.273
See application file for complete search history.

(56) References Cited

U.S. PATENT DOCUMENTS

| 8,354,677 B2 | 1/2013 | Park et al. |
| 2012/0001182 A1 | 1/2012 | Choi et al. |
| 2014/0124746 A1* | 5/2014 | Hwang ........................... 257/40 |

FOREIGN PATENT DOCUMENTS

| KR | 10-2011-0121419 A | 11/2011 |
| KR | 10-2012-0003166 A | 1/2012 |

* cited by examiner

*Primary Examiner* — Hoai V Pham
(74) *Attorney, Agent, or Firm* — Lee & Morse, P.C.

(57) ABSTRACT

An organic light-emitting display apparatus includes an active layer of a thin film transistor (TFT), a gate electrode including a transparent conductive material or a metal that on the active layer, a first insulating layer on the substrate, source and drain electrodes electrically connected to the active layer, a second insulating layer between the gate electrode and the source and drain electrodes, a first conductive layer of a transparent conductive material on the first insulating layer, a second conductive layer on the first conductive layer, the second conductive layer being a metal, a third conductive layer on the second conductive layer, the third conductive layer being made of a same material as the source and drain electrodes, and being connected to the first conductive layer; and a protection layer that includes a transparent conductive oxide, the protection layer being on the third conductive layer.

20 Claims, 10 Drawing Sheets

ORGANIC LIGHT-EMITTING DISPLAY APPARATUS AND METHOD OF MANUFACTURING THE SAME

CROSS-REFERENCE TO RELATED PATENT APPLICATION

Korean Patent Application No. 10-2013-0016056, filed on Feb. 14, 2013, in the Korean Intellectual Property Office and entitled "Organic Light-Emitting Display Apparatus and Method of Manufacturing the Same," is incorporated herein in its entirety by reference.

BACKGROUND

1. Field

Embodiments relate to an organic light-emitting display apparatus and a method of manufacturing the same.

2. Description of the Related Art

An organic light-emitting display apparatus is not only lightweight and thin but also has wide viewing angles, fast response speeds, and low consumption power, and is thus regarded as a next-generation display apparatus.

SUMMARY

Embodiments are directed to an organic light-emitting display apparatus including an active layer of a thin film transistor (TFT) on a substrate, a gate electrode in a form of a stack structure including a transparent conductive material or a metal that is stacked on the active layer, a first insulating layer on the substrate, including between the active layer and the gate electrode, source and drain electrodes on a second insulating layer, the second insulating layer being between the gate electrode and the source and drain electrodes, and the source and drain electrodes being electrically connected to the active layer, a first conductive layer on the first insulating layer, the first conductive layer being made of a transparent conductive material, a second conductive layer on the first conductive layer, the second conductive layer being made of a metal, a third conductive layer on the second conductive layer, the third conductive layer being made of a same material as the source and drain electrodes, the third conductive layer being connected to the first conductive layer, and a protection layer that includes a transparent conductive oxide, the protection layer being on the third conductive layer.

The gate electrode may include a first gate electrode formed of a transparent conductive material and a second gate electrode formed of a metal. The first and second gate electrodes may be sequentially stacked.

The second conductive layer may be patterned such that a portion of the first conductive layer is exposed.

The third conductive layer may contact the first conductive layer, the second conductive layer, and a portion of the first insulating layer on an outer portion of the first conductive layer.

The second insulating layer may be between the second conductive layer and the third conductive layer. The third conductive layer may contact the first conductive layer. The second insulating layer may be interposed between the first conductive layer and the third conductive layer.

The second insulating layer may surround all external lateral sides of the second conductive layer. The third conductive layer contacts portions of the first conductive layer and the second conductive layer.

The transparent conductive oxide may include at least one material selected from the group of tin oxide (ITO), indium zinc oxide (IZO), zinc oxide (ZnO), indium oxide ($In_2O_3$), indium gallium oxide (IGO), and aluminum zinc oxide (AZO).

The protection layer may further include a semi-transmissive metal layer.

The protection layer may include at least one material selected from the group of Ag, Ag alloy, Al, and Al alloy.

The protection layer may have a stack structure in which a transparent conductive oxide, a semi-transmissive metal layer, and a transparent conductive oxide are sequentially stacked.

The protection layer may be on the third conductive layer and may protect the third conductive layer from external substances.

The active layer may include a semiconductor doped with ion impurities.

The semiconductor may include amorphous silicon or crystalline silicon.

The organic light-emitting display apparatus may further include a capacitor bottom electrode that includes a same material as the active layer and is on a same layer as the active layer, and a capacitor top electrode that includes a same material as the first gate electrode and is on the first insulating layer.

Embodiments are also directed to a method of manufacturing an organic light-emitting display apparatus including a first mask operation in which an active layer is formed on a substrate, a second mask operation in which a first insulating layer, a transparent conductive material, and a metal are sequentially stacked on the active layer, and the transparent conductive material and the metal are patterned at the same time to form a gate electrode of a thin film transistor, a first conductive layer including a transparent conductive material in a pad region, and a second conductive layer including a metal, a third mask operation in which a second insulating layer is formed on a resultant product of the second mask operation, and the second insulating layer is patterned to form an opening that exposes source and drain regions of the active layer and the first conductive layer, a fourth mask operation in which a metal layer is formed on a resultant product of the third mask operation, and the metal layer is patterned to form source and drain electrodes that contact the source and drain regions of the active layer and a third conductive layer that contacts the first conductive layer, and a fifth mask operation in which a transparent conductive oxide layer is formed on a resultant product of the fourth mask operation, and the transparent conductive oxide layer is patterned to form a protection layer on the third conductive layer.

In the second mask operation, the second conductive layer may be patterned such that a portion of the first conductive layer is exposed.

In the third mask operation, the first conductive layer, the second conductive layer, and the first insulating layer disposed on the outer portion of the first conductive layer may be patterned such that portions of the first conductive layer, the second conductive layer, and the first insulating layer are exposed.

In the third mask operation, the first conductive layer and the second conductive layer may be patterned such that portions of the first conductive layer and the second conductive layer are exposed.

The protection layer may have a stack structure in which an oxide, a semi-transmissive metal layer, and a transparent conductive oxide are sequentially stacked.

Embodiments are also directed to an organic light-emitting display apparatus, including a thin film transistor (TFT) including a gate electrode, a source electrode, and a drain electrode, a light-emitting region including a pixel electrode, an opposite electrode, and an organic emissive layer, and a pad region including a pad electrode and a protection layer formed on the pad electrode. The pad electrode includes a first conductive layer on a first insulating layer, the first conductive layer being formed of a transparent conductive material, a second conductive layer on the first conductive layer, the second conductive layer being formed of a metal, and a third conductive layer on the second conductive layer and connected to the first conductive layer, the third conductive layer being formed of a same material as the source electrode and the drain electrode of the TFT. The protection layer has a stack structure in which a transparent conductive oxide, a semi-transmissive metal layer, and a transparent conductive oxide are sequentially stacked.

BRIEF DESCRIPTION OF THE DRAWINGS

Features will become more apparent by describing in detail exemplary embodiments thereof with reference to the attached drawings in which.

DETAILED DESCRIPTION

Embodiments will now be described more fully with reference to the accompanying drawings, in which exemplary embodiments are shown. These embodiments are provided so that this disclosure will be thorough and complete, and will fully convey exemplary implementations to those skilled in the art. It should be understood that the embodiments may vary but do not have to be mutually exclusive. For example, particular shapes, structures, and properties according to a predetermined embodiment described in this specification may be modified in other embodiments without departing from the spirit and scope thereof. In addition, positions or arrangement of individual components of each of the embodiments may also be modified without departing from the spirit and scope. Accordingly, the detailed description below should not be construed as having limited meanings but construed to encompass the scope of the claims and any equivalent ranges thereto. In the drawings, like reference numerals denote like elements in various aspects.

As used herein, the term "and/or" includes any and all combinations of one or more of the associated listed items. Expressions such as "at least one of," when preceding a list of elements, modify the entire list of elements and do not modify the individual elements of the list.

Figure 1:
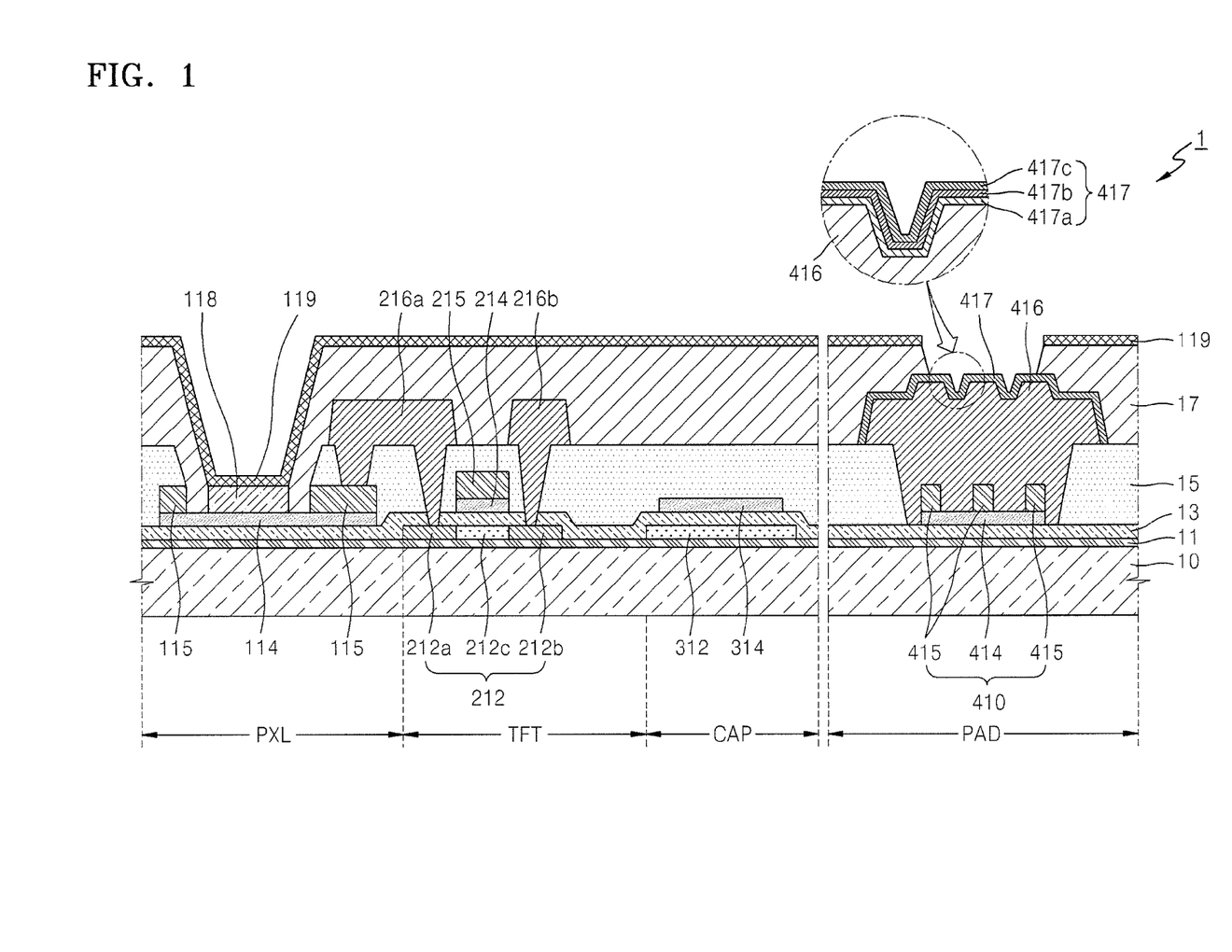
FIG. 1 is a schematic cross-sectional view illustrating an organic light-emitting display apparatus according to an embodiment.

FIG. 1 is a schematic cross-sectional view illustrating an organic light-emitting display apparatus 1 according to an embodiment.

Referring to FIG. 1, a pixel region PXL including an emissive layer 118, a transistor region TFT including a thin film transistor (TFT), a capacitor region CAP including a capacitor, and a pad region PAD including wirings are formed on a substrate 10.

In the transistor region TFT, an active layer 212 of the TFT is formed on the substrate 10 and a buffer layer 11. The active layer 212 may be formed of a semiconductor including amorphous silicon or crystalline silicon. The active layer 212 may include source and drain regions 212a and 212b that are doped with ion impurities and a channel region 212c.

A first gate electrode 214 and a second gate electrode 215 that include a transparent conductive material at a position corresponding to the channel region 212c of the active layer 212 are sequentially formed on the active layer 212, and a first insulating layer 13 is interposed between the channel region 212c and the first and second gate electrodes 214 and 215.

Source and drain electrodes 216a and 216b that contact the source and drain regions 212a and 212b of the active layer 212, with a second insulating layer 15 included therebetween, are formed on the first and second gate electrodes 214 and 215. A third insulating layer 17 is formed on a second insulating layer 15 to cover the source and drain electrodes 216a and 216b.

In the capacitor region CAP, a capacitor bottom electrode 312 that is formed of the same material as the active layer 212 of the TFT, the first insulating layer 13, and a capacitor top electrode 314 that is formed of the same material as a first pixel electrode 114 are sequentially formed on the substrate 10 and a buffer layer 11. The capacitor bottom electrode 312 may include a semiconductor doped with ion impurities as the same material as the active layer 212 of the TFT.

In the pixel area PXL, the first pixel electrode 114 formed of the same transparent conductive material as the first gate electrode 214 and a second pixel electrode 115 formed of the same material as the second gate electrode 215 and is disposed on an upper edge of the first pixel electrode 114 are sequentially formed on the substrate 10, the buffer layer 11, and the first insulating layer 13.

According to the current embodiment, the second pixel electrode 115 is disposed on the upper edge of the first pixel electrode 114. However, in other implementations, the second pixel electrode 115 may be omitted.

An opposite electrode 119 is disposed to face the first pixel electrode 114, and an emissive layer 118 is disposed between the first pixel electrode 114 and the opposite electrode 119.

The emissive layer 118 may be a low-molecular organic material or a polymer organic material. When the emissive layer 118 is a low-molecular organic material, a hole transport layer (HTL), a hole injection layer (HIL), an electron transport layer (ETL), and an electron injection layer (EIL), or the like may be stacked with respect to the emissive layer 118. Examples of organic materials that may be used include copper phthalocyanine (CuPc), N,N'-di(naphthalen-1-yl)-N,N'-diphenyl-benzidine (NPB), and tris-8-hydroxyquinoline aluminum (Alq3).

When the emissive layer 118 is a polymer organic material, an HTL may be further included in addition to the emissive layer 118. The HTL may be formed of poly-(3,4)-ethylene-dihydroxy thiophene (PEDOT) or polyaniline (PANI). Examples of organic materials that may be used are poly-phenylenevinylene (PPV)-based polymer organic materials and polyfluorene-based polymer organic materials.

The opposite electrode 119 is deposited on the emissive layer 118 as a common electrode. In the organic light-emitting display apparatus 1 according to the current embodiment, the first and second pixel electrodes 114 and 115 are used as anode electrodes, and the opposite electrode 119 is used as a cathode electrode. However, in other implementations, the polarities of the electrodes may be exchanged.

The opposite electrode 119 may be formed of a reflective electrode including a reflective material. In this case, the opposite electrode 119 may include at least one material selected from the group of Al, Mg, Li, Ca, LiF/Ca, and LiF/Al.

When the opposite electrode 119 is included as a reflective electrode, light emitted from the emissive layer 118 is reflected by the opposite electrode 119 and transmits through the first pixel electrode 114 formed of a transparent conductive material, and is emitted to the substrate 10.

A light reflection unit that is formed of the same material as the source and drain electrodes 216a and 216b, with the second insulating layer 15 included therebetween, may be disposed on an upper edge of the first pixel electrode 114.

Finally, in the pad region PAD, which is on the outer portion of the organic light-emitting display apparatus 1 according to the current embodiment, a pad electrode which is a connection terminal of an external driver is formed. In detail, a first conductive layer 414 that is formed of the same material as the first gate electrode 214 of the TFT, a second conductive layer 415 that is formed of the same material as the second gate electrode 215, a third conductive layer 416 that is formed of the same material as the source/drain electrodes 216, and a protection layer 417 that is formed on the third conductive layer 416 are sequentially formed on the pad substrate 10 and the buffer layer 11. Hereinafter, the first conductive layer 414, the second conductive layer 415, and the third conductive layer 416 may be referred to as pad electrodes 410.

The protection layer 417 may be formed of a first layer 417a including a transparent conductive oxide, a semi-transmissive metal layer 417b, and a second layer 417c including a transparent conductive oxide. When the protection layer 417 is formed, a stable transparent conductive oxide is disposed on the pad electrodes 414, 415, and 416, and accordingly, the effect of preventing or hindering corrosion is provided.

The first layer 417a and the second layer 417c including a transparent conductive oxide may include at least one material selected from the group of indium tin oxide (ITO), indium zinc oxide (IZO), zinc oxide (ZnO), indium oxide ($In_2O_3$), indium gallium oxide (IGO) and aluminum zinc oxide (AZO). The first layer 417a disposed between the third conductive layer 416. The semi-transmissive metal layer 417b may reduce an adhesive stress between the third conductive layer 416 and the semi-transmissive metal layer 417b. Also, the second layer 417c, which is highly resistant to corrosion, finally protects the pad electrodes 414, 415, and 416, and thus, the organic light-emitting display apparatus 1 may have a rigid structure under a corrosive environment.

The semi-transmissive metal layer 417b may be formed of at least one material selected from the group of silver (Ag), Ag alloy, aluminum (Al), and Al alloy.

While not illustrated in FIG. 1, the organic light-emitting display apparatus 1 according to the current embodiment may further include an encapsulation member (not shown) that encapsulates a display region including a pixel region PXL1, a capacitor region CAP1, and a transistor region TR1. The encapsulation member may be formed of a substrate including a glass material, a metal film, or an encapsulation thin film in which an organic insulating layer and an inorganic insulating layer are alternately arranged.

FIGS. 2A through 2E schematically illustrate a method of manufacturing the organic light-emitting display apparatus 1 of FIG. 1, according to an embodiment. The method of manufacturing the organic light-emitting display apparatus 1, according to the current embodiment, will be described with reference to FIGS. 2A through 2E.

Figure 2A:
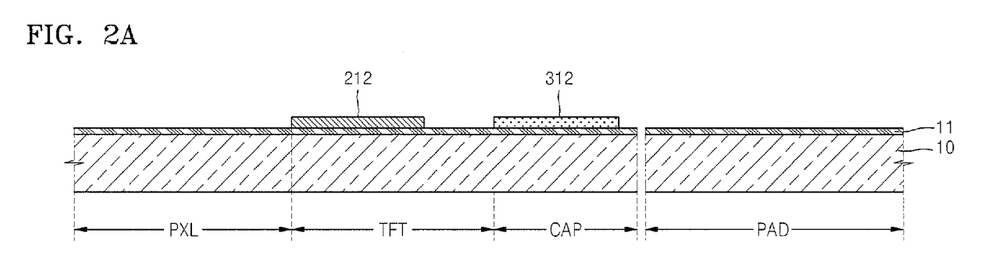
FIGS. 2A through 2E schematically illustrate a method of manufacturing the organic light-emitting display apparatus of FIG. 1, according to an embodiment.

FIG. 2A is a schematic cross-sectional view illustrating a result of a first mask operation performed in the method of manufacturing the organic light-emitting display apparatus 1 according to an embodiment.

Referring to FIG. 2A, an active layer 212 of a TFT is formed in the TFT region TFT on a substrate 10 on which a buffer layer 11 is stacked, and a capacitor bottom electrode 312 is formed in the capacitor region CAP.

The substrate 10 may be formed of a transparent glass material including $SiO_2$ as a main component, and the buffer layer 11 that includes $SiO_2$ and/or $SiN_x$ may be further formed on the substrate 10 to provide planarization of the substrate 10 and prevent penetration of impurity elements into the substrate 10.

While not shown in FIG. 2A, a semiconductor layer (not shown) may be deposited on the buffer layer 11, and a photoresist (not shown) may be coated on the semiconductor layer (not shown), and the semiconductor layer (not shown) may be patterned by using a photolithography operation in which a first photomask (not shown) is used, thereby forming the active layer 212 of the TFT and the capacitor bottom electrode 312 at the same time.

In the first mask operation in which the photolithography is used, after exposing semiconductor layer to the first photomask by using an exposure equipment (not shown), a series of operations such as developing, etching, and stripping or ashing are performed.

The semiconductor layer (not shown) may be formed of amorphous silicon or crystalline silicon (polysilicon). Here, the crystalline silicon may be formed by crystallizing the amorphous silicon. Examples of a method of crystallizing amorphous silicon include a rapid thermal annealing (RTA) method, a solid phase crystallization (SPC) method, an excimer laser annealing (ELA) method, a metal-induced crystallization (MIC) method, a metal-induced lateral crystallization (MILC) method, or a sequential lateral solidification (SLS) method.

Figure 2B:
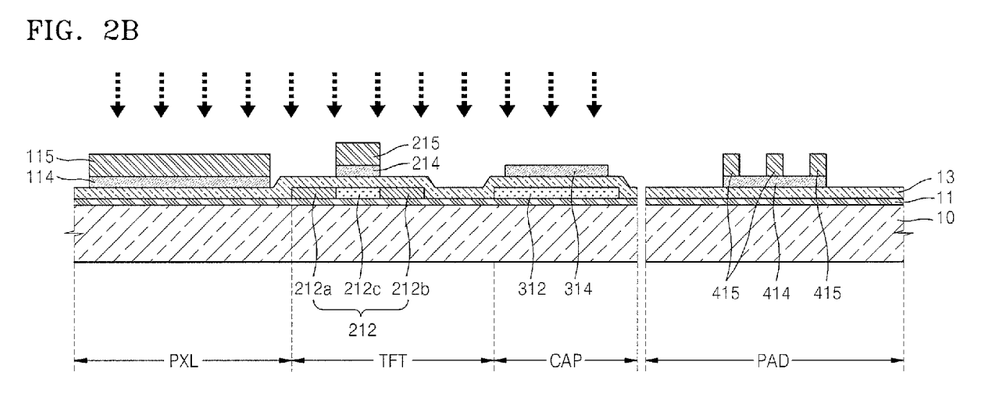

FIG. 2B is a schematic cross-sectional view illustrating a result of a second mask operation performed in the method of manufacturing the organic light-emitting display apparatus 1 according to an embodiment.

Referring to FIG. 2B, a first insulating layer 13 is stacked on a resultant product of the first mask operation of FIG. 2A, and a transparent conductive material and a layer (not shown) including a metal are sequentially stacked on the first insulating layer 13 and patterned.

As a result of patterning, a first pixel electrode 114 including a transparent conductive material and a second pixel electrode 115 including a metal are sequentially formed on the first insulating layer 13 in the pixel region PXL. A first gate electrode 214 including a transparent conductive material and a second gate electrode 215 including a metal are sequentially formed in the TFT region, and a capacitor top electrode 314 including a transparent conductive material is formed in the capacitor region CAP at the same time. Also, a first conductive layer 414 including a transparent conductive material and a second conductive layer 415 including a metal are formed on the first insulating layer 13 in the pad region PAD.

Referring to FIG. 2B, edge portions of external etching surfaces of the first gate electrode 214 and the second gate electrode 215 are the same, and also, edge portions of external etching surfaces of the first pixel electrode 114 and the second pixel electrode 115 are the same. However, etching surfaces of the first conductive layer 414 and the second conductive layer 415 of the pad region PAD are formed differently.

The first insulating layer 13 may include a single layer or a plurality of layers formed of $SiO_2$, $SiN_X$, or the like. The first insulating layer 13 functions as a gate insulating of the TFT and a dielectric layer of the capacitor.

The transparent conductive materials, of which the first pixel electrode 114, the first gate electrode 214, the capacitor top electrode 314, and the first conductive layer 414 are formed, may include at least one material selected from the group of ITO, IZO, ZnO, $In_2O_3$, IGO, and AZO.

The second gate electrode 215 and the second conductive layer 415 may be formed of at least one metal selected from the group of Al, Pt, Ag, Mg, Au, Ni, Nd, Ir, Cr, Li, Ca, Mo, Ti, W, and Cu, and as a single layer or multiple layers.

According to the current embodiment, as described above, in order to differentiate etching surfaces of the first conductive layer 414 and the second conductive layer 415, a half-tone mask may be used as a second photomask (not shown) during the second mask operation. Also, the half-tone mask as described above may prevent a metal layer such as the second gate electrode 215 from being formed on the capacitor top electrode 314.

The above-described structure is doped with ion impurities. As ion impurities, B or P ions are doped, namely, at a density of $1\times10^{15}$ atoms/cm$^2$ or higher, and the doping is performed by using the capacitor bottom electrode 312 formed of a semiconductor and the active layer 212 of the TFT as targets.

Accordingly, the conductivity of the capacitor bottom electrode 312 is increased to form a metal-insulator-metal (MIM) capacitor together with the first insulating layer 13 and the capacitor top electrode 314, and the capacity of the capacitor may be increased accordingly.

Also, the active layer 212 is doped with ion impurities by using the gate electrodes 214 and 215 as a self-aligned mask so that the active layer 212 includes source and drain regions 212a and 212b and a channel region 212c therebetween. That is, by using the gate electrodes 214 and 215 as a self-aligned mask, the source and drain regions 212a and 212b may be formed without adding an additional photo mask.

Figure 2C:
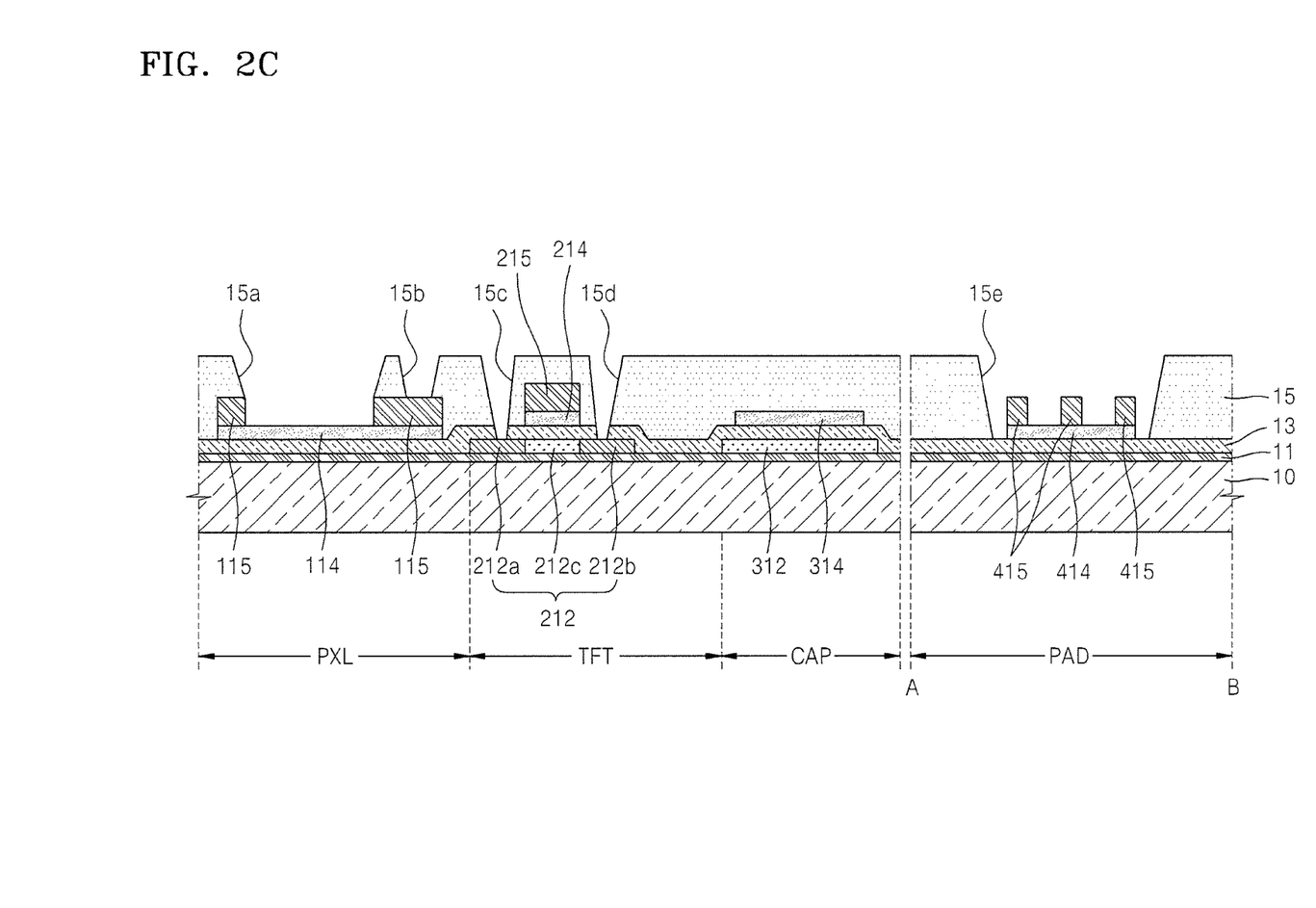

FIG. 2C is a schematic cross-sectional view illustrating a result of a third mask operation performed in the method of manufacturing the organic light-emitting display apparatus 1 according to an embodiment.

Referring to FIG. 2C, a second insulating layer 15 is stacked on a resultant product of the second mask operation of FIG. 2B, and the second insulating layer 15 is patterned to form a first opening 15a that exposes the first pixel electrode 114, a second opening 15b that exposes the second pixel electrode 115, a third opening 15c that exposes the source region 212a of the active layer 212, a fourth opening 15d that exposes the drain region 212b, and a fifth opening 15e that exposes the first and second conductive layers 414 and 415 are formed.

As described above, after patterning of the second insulating layer 15 whereby the first through fifth openings 15a through 15e are formed, a portion of the second pixel electrode 115 exposed by the first opening 15a is removed. Without adding an additional mask operation, the second pixel electrode 115 may be etched by inputting an etching solution that is capable of etching the second pixel electrode 115, which includes a metal. However, in other implementations a portion of the second pixel electrode 115 may also be removed during the second mask operation described above.

Figure 2D:
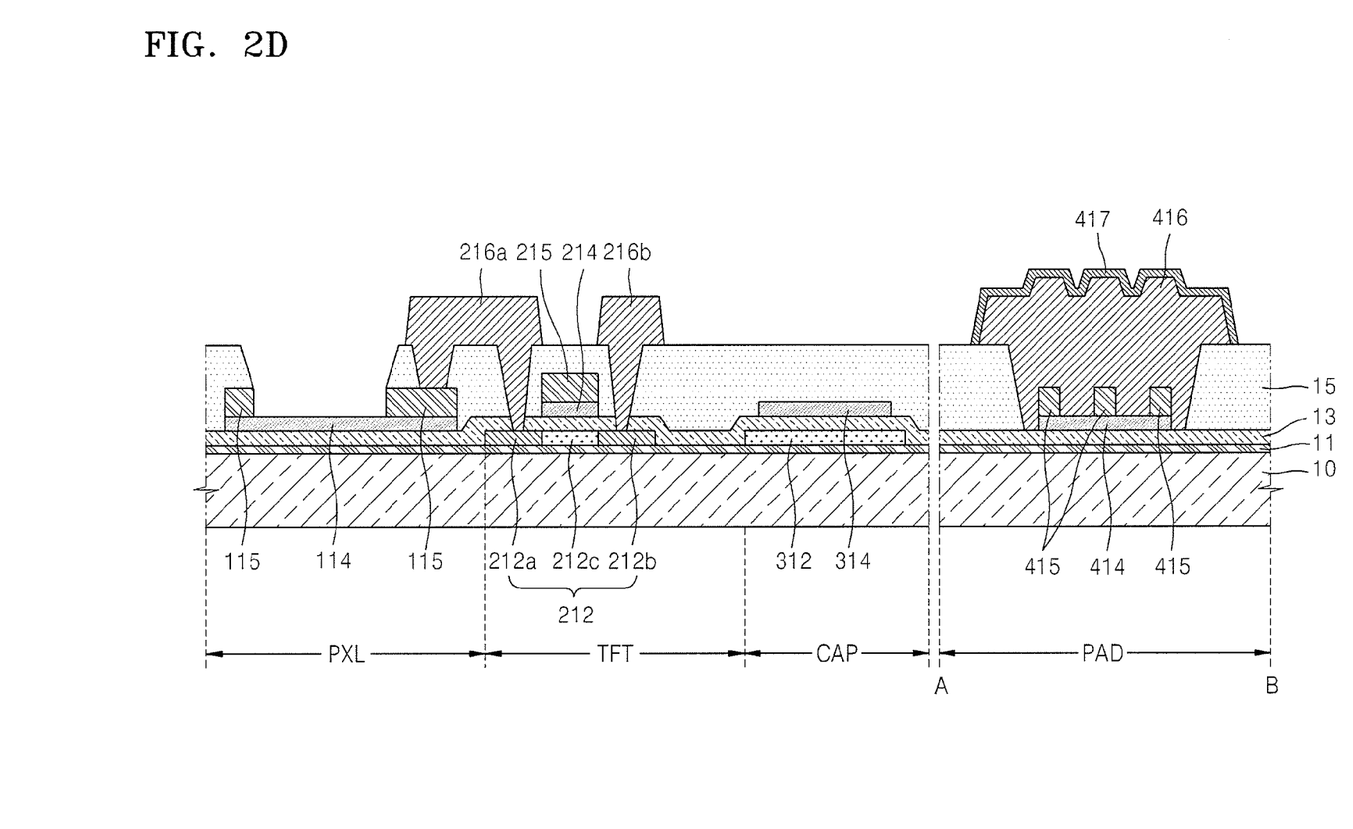
Figure 3A:
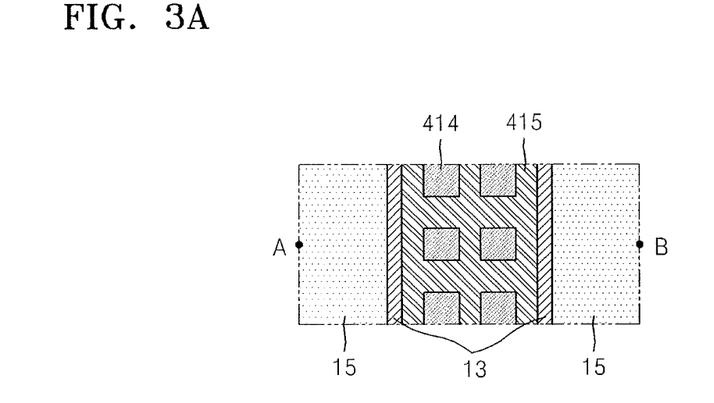
FIGS. 3A through 3B are schematic top views of a structure of a pad region of FIGS. 2C and 2D.
Figure 3B:
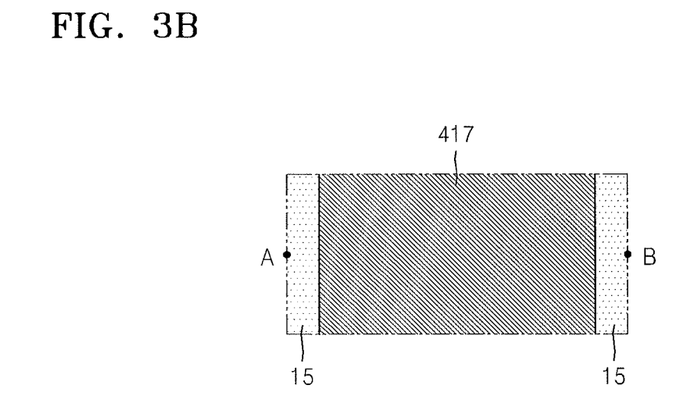

FIGS. 3A and 3B are schematic top views of a structure of the pad region PAD of FIGS. 2C and 2D.

Referring to FIG. 3A, two sides of the pad region PAD of FIG. 2C are surrounded by the second insulating layer 15, and a portion of the first insulating layer 13 is exposed between the second insulating layer 15 and the first and second conductive layers 414 and 415. Also, by using the half-tone mask operation as described above, not only the second conductive layer 415 but a portion of the first conductive layer 414 is also exposed.

The third conductive layer 416 contacts exposed upper portions of the first and second pad electrodes 414 and 415 that are illustrated in FIG. 3A, and as illustrated in FIG. 3B, the third conductive layer 416 is covered by the protection layer 417. As a result, the pad electrodes 410 are not exposed when the pad region PAD is viewed from above, and thus, the organic light-emitting display apparatus 1 has a rigid structure with respect to corrosion.

FIG. 2D is a schematic cross-sectional view illustrating a result of fourth and fifth mask operations performed on the organic light-emitting display apparatus 1 according to an embodiment.

Referring to FIG. 2D, the second through fourth openings 15b, 15c, and 15d formed in the second insulating layer 15 of the TFT region TFT are filled, and the source and drain electrodes 216a and 216b are formed on the second insulating layer 15, and the fifth opening 15e formed in the pad region PAD is filled, and the third conductive layer 416 formed of the same material as the source and drain electrodes 216a and 216b is formed on the first and second conductive layers 414 and 415 by using a fourth mask operation. Here, the third conductive layer 416 may not only directly contact the second conductive layer 415 but also the first conductive layer 414, thereby increasing an adhesive force between the layers.

In addition, a protection layer 417 is formed on the third conductive layer 416 of the pad region PAD in the fifth mask operation in order to prevent corrosion. As described above with reference to FIG. 1, the protection layer 417 may be formed of a semi-transmissive electrode that includes a first layer 417a, a semi-transmissive metal layer 417b, and a second layer 417c.

The first layer 417a and the second layer 417c including a transparent conductive oxide may include at least one material selected from the group of ITO, IZO, ZnO, $In_2O_3$, IGO, and AZO. The semi-transmissive metal layer 417b may be formed of at least one material selected from the group of Ag, Ag alloy, Al, and Al alloy.

Figure 2E:
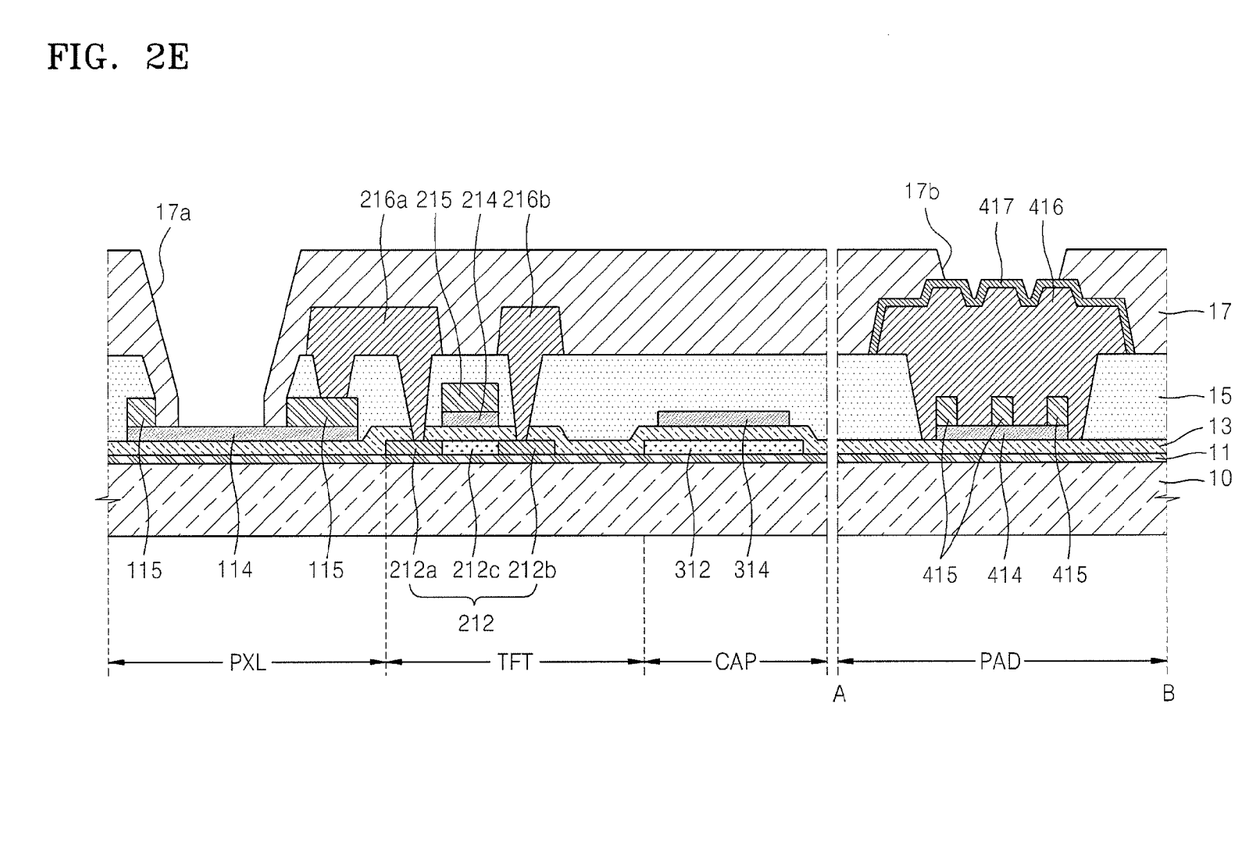

FIG. 2E is a schematic cross-sectional view illustrating a result of a sixth mask operation performed in the method of manufacturing the organic light-emitting display apparatus 1 according to an embodiment.

Referring to FIG. 2E, a third insulating layer 17 is stacked on a resultant product of the fifth mask operation of FIG. 2D and patterned to form a first opening 17a that exposes an upper portion of the first pixel electrode 114 and a second opening 17b that exposes the protection layer 417 of the pad region PAD.

Besides defining a light emission area, the first opening 17a performs the function of widening intervals between edges of the first and second pixel electrodes 114 and 115 and the opposite electrode 119 (see FIG. 1) to prevent concentration of an electrical field on the edges of the first and second pixel electrodes 114 and 115, thereby preventing a short circuit of the first and second pixel electrodes 114 and 115 and the opposite electrode 119. Also, the third insulating layer 17 may be interposed between the emissive layer 118 (see FIG. 1) and the light reflecting unit so as to prevent a short circuit which may occur otherwise when the emissive layer 118 and the light reflecting unit 116 contact each other directly. The third insulating layer 17 may be formed of an organic insulating layer or an inorganic insulating layer.

The protection layer 417 may be formed by alternately stacking a transparent conductive oxide, a semi-transmissive metal, and a transparent conductive oxide on a top layer of the pad region PAD, according to the organic light-emitting display apparatus 1 (see FIG. 1) of the embodiments. Accordingly, corrosion of the pad electrodes 414, 415, and 416 may be prevented, and also, at the same time, contact resistance may be reduced.

Figure 4:
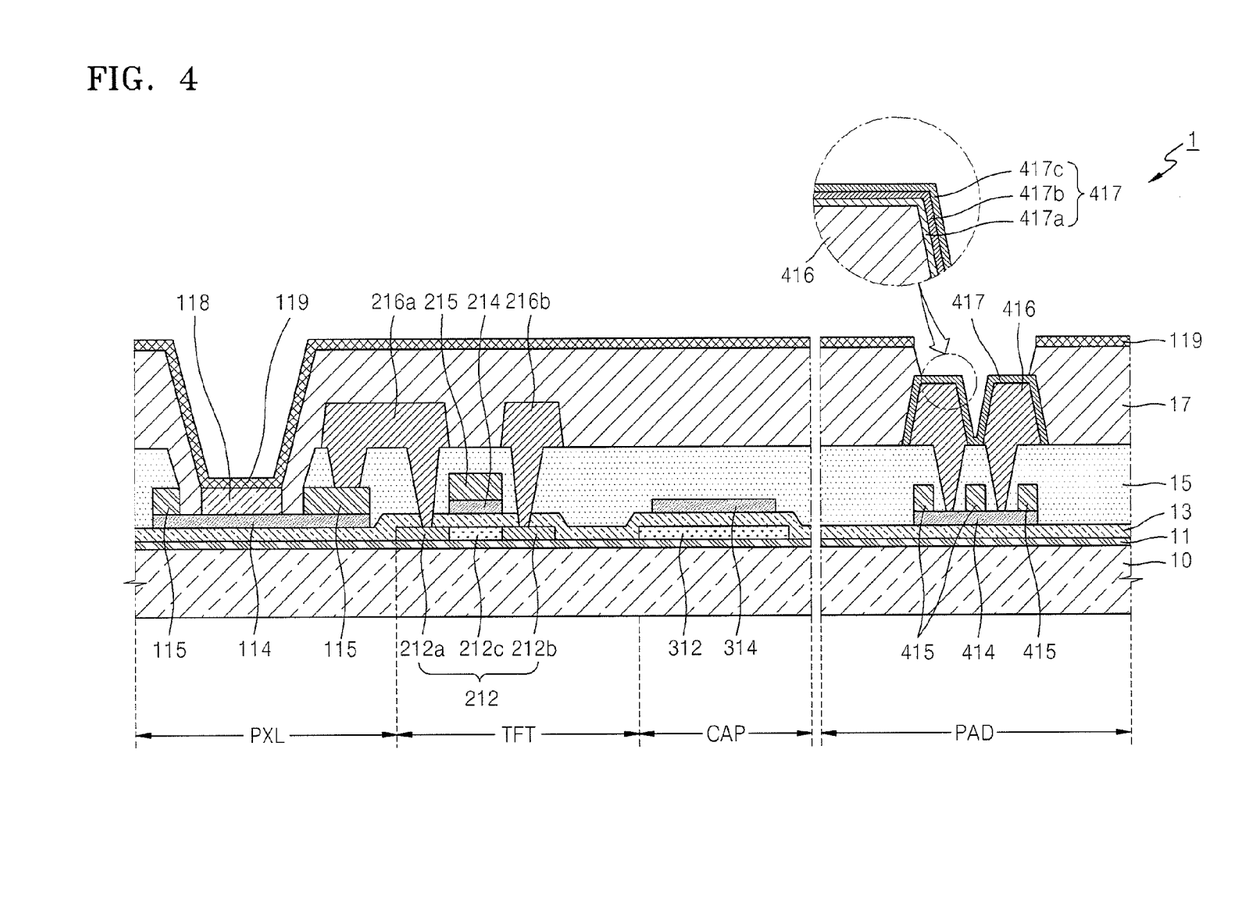
FIG. 4 is a schematic cross-sectional view illustrating an organic light-emitting display apparatus according to another embodiment.

FIG. 4 is a schematic cross-sectional view illustrating an organic light-emitting display apparatus 1 according to another embodiment.

The organic light-emitting display apparatus 1 illustrated in FIG. 4 is a modification example of the organic light-emitting display apparatus 1 of FIG. 1, and thus, description of common elements will not be repeated but different characteristics will be described.

Referring to FIG. 4, unlike the organic light-emitting display apparatus 1 of FIG. 1, the second insulating layer 15 is removed only from portions where the second conductive layer 415 is not formed, so that the third conductive layer 416 and the first conductive layer 414 contact each other directly. Like in the embodiment of FIG. 4, when the first conductive layer 414, which is a transparent electrode, directly contacts the third conductive layer 416, an adhesive force between the layers may be intensified. Instead of a structure in which the third conductive layer (416) is not directly connected to an upper portion of the pad region PAD, the second conductive layer 415 and the third conductive layer 416 may be connected to the outside of the pad region PAD.

Figure 5:
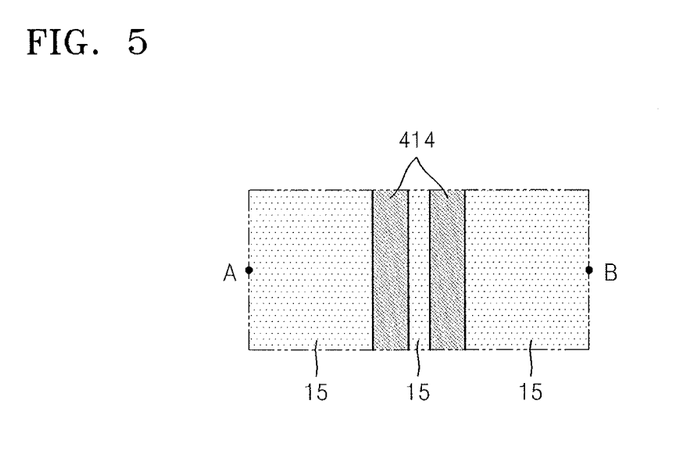
FIG. 5 is a top view of a pad region of the organic light-emitting display apparatus of FIG. 4.

FIG. 5 is a top view illustrating the pad region PAD of the organic light-emitting display apparatus 1 of FIG. 4 after the second insulating layer 15 is generated. As shown in FIG. 5, the second insulating layer 15 is patterned such that only a portion of the first conductive layer 414 is exposed, and as the second conductive layer 415 is not exposed, when the third conductive layer 416 is formed on the second insulating layer 15, the third conductive layer 416 contacts only the first conductive layer 414.

As in the embodiment of FIG. 1, the protection layer 417 is formed on the third conductive layer 416, thereby preventing or hindering corrosion of the pad electrodes 410.

Figure 6:
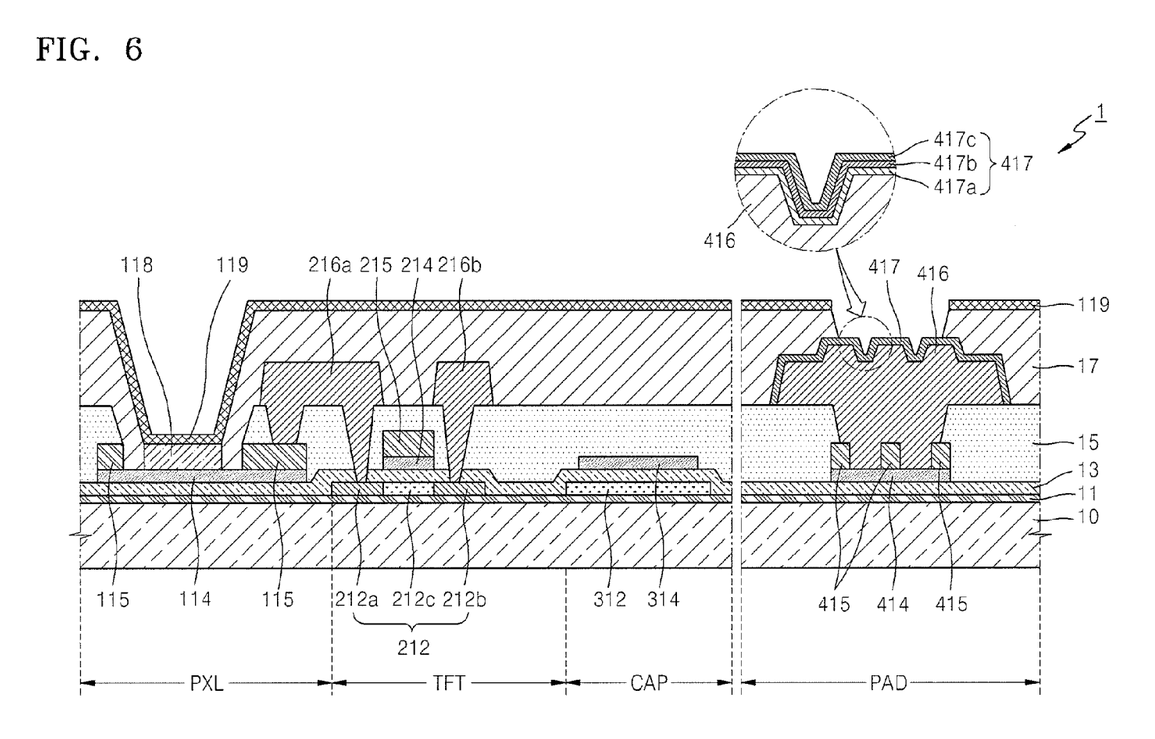
FIG. 6 is a schematic cross-sectional view of an organic light-emitting display apparatus according to another embodiment.

FIG. 6 is a schematic cross-sectional view illustrating an organic light-emitting display apparatus 1 according to another embodiment.

The organic light-emitting display apparatus 1 illustrated in FIG. 6 is a modification example of the organic light-emitting display apparatus 1 of FIG. 1, and thus, description of common elements will not be repeated but only different characteristics will be described.

Referring to FIG. 6, unlike the embodiment of FIG. 1, when the second insulating layer 15 is patterned, the second insulating layer 15 is formed not on an outer portion of the second conductive layer 415 but on an upper portion of the second conductive layer 415 so as to prevent corrosion of the second conductive layer 415 by penetration of an etchant or vapor into sides thereof.

Figure 7:
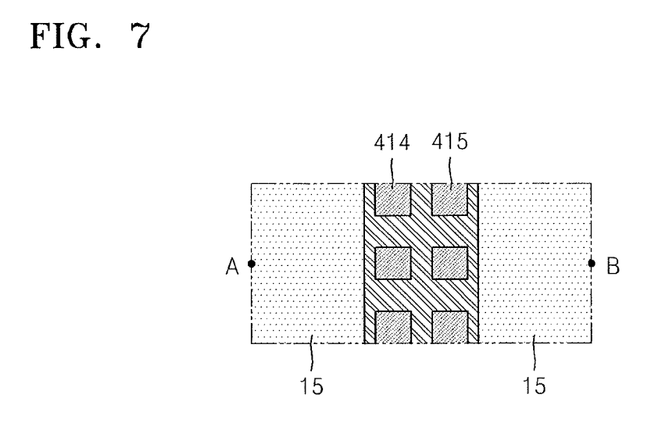
FIG. 7 is a top view of a pad region of the organic light-emitting display apparatus of FIG. 6.

FIG. 7 is a top view of the pad region PAD of the organic light-emitting display apparatus 1 of FIG. 6 after stacking the second insulating layer 15.

Referring to FIG. 7, portions of the first and second conductive layers 414 and 415 are exposed, and unlike FIG. 1, a portion of the first insulating layer 13 is not exposed. Accordingly, a side of the second conductive layer 415 is not exposed to the outside but is protected by the second insulating layer 15, thereby preventing or hindering corrosion of pad electrodes 410 due to penetration of foreign substances through the sides of the organic light-emitting display apparatus 1.

By way of summation and review, a flat panel display apparatus such as an organic light-emitting display apparatus or a liquid crystal display apparatus includes a thin film transistor (TFT), a capacitor, and wirings that connect these elements.

A pad electrode is disposed on an outer portion of an organic light-emitting display apparatus. However, a metal of the pad electrode may be exposed on the front side thereof, and thus may be likely to corrode. Consequently, reliability of the organic light-emitting display apparatus may be degraded. In addition, when the pad electrode is reprocessed, adhesive properties thereof may be low, which may make it difficult to reduce the defective rate.

According to the embodiments, an organic light-emitting display apparatus that has an excellent adhesive force and is highly resistant to corrosion may be provided.

The use of the terms "a", "an", and "the" and similar referents in the context of describing embodiments (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein can be performed in any suitable order unless otherwise indicated herein or otherwise clearly contradicted by context. The use of any and all examples, or exemplary language (e.g., "such as") provided herein, is intended merely to better illuminate described embodiments and does not pose a limitation on the scope thereof unless otherwise claimed. Numerous modifications and adaptations will be readily apparent to those skilled in this art without departing from the spirit and scope.

While embodiments have been particularly shown and described with reference to exemplary embodiments thereof, it will be understood by those of ordinary skill in the art that various changes in form and details may be made therein without departing from the spirit and scope thereof as defined by the appended claims. The exemplary embodiments should be considered in descriptive sense only and not for purposes of limitation. Therefore, the scope thereof is defined not by the detailed description but by the appended claims, and all differences within the scope will be construed as being included therein.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:
1. An organic light-emitting display apparatus, comprising:
    an active layer of a thin film transistor (TFT) on a substrate;
    a gate electrode in a form of a stack structure including a
        transparent conductive material or a metal that is stacked
        on the active layer;

a first insulating layer on the substrate and between the active layer and the gate electrode;

source and drain electrodes on a second insulating layer, the second insulating layer being between the gate electrode and the source and drain electrodes, and the source and drain electrodes being electrically connected to the active layer;

a first conductive layer on the first insulating layer, the first conductive layer being made of a transparent conductive material;

a second conductive layer on the first conductive layer, the second conductive layer being made of a metal;

a third conductive layer on the second conductive layer, the third conductive layer being made of a same material as the source and drain electrodes, the third conductive layer being connected to the first conductive layer; and a protection layer that includes a transparent conductive oxide, the protection layer being on the third conductive layer.

2. The organic light-emitting display apparatus as claimed in claim 1, wherein:

the gate electrode includes a first gate electrode formed of a transparent conductive material and a second gate electrode formed of a metal, and the first and second gate electrodes are sequentially stacked.

3. The organic light-emitting display apparatus as claimed in claim 2, further comprising:

a capacitor bottom electrode that includes a same material as the active layer and is on a same layer as the active layer; and a capacitor top electrode that includes a same material as the first gate electrode and is on the first insulating layer.

4. The organic light-emitting display apparatus as claimed in claim 1, wherein the second conductive layer is patterned such that a portion of the first conductive layer is exposed.

5. The organic light-emitting display apparatus as claimed in claim 1, wherein the third conductive layer contacts the first conductive layer, the second conductive layer, and a portion of the first insulating layer on an outer portion of the first conductive layer.

6. The organic light-emitting display apparatus as claimed in claim 1, wherein:

the second insulating layer is between the second conductive layer and the third conductive layer, the third conductive layer contacts the first conductive layer, and the second insulating layer is interposed between the first conductive layer and the third conductive layer.

7. The organic light-emitting display apparatus as claimed in claim 1, wherein:

the second insulating layer surrounds all external lateral sides of the second conductive layer, and the third conductive layer contacts portions of the first conductive layer and the second conductive layer.

8. The organic light-emitting display apparatus as claimed in claim 1, wherein the transparent conductive oxide includes at least one material selected from the group of tin oxide (ITO), indium zinc oxide (IZO), zinc oxide (ZnO), indium oxide ($In_2O_3$), indium gallium oxide (IGO)m and aluminum zinc oxide (AZO).

9. The organic light-emitting display apparatus as claimed in claim 1, wherein the protection layer further includes a semi-transmissive metal layer.

10. The organic light-emitting display apparatus as claimed in claim 9, wherein the protection layer includes at least one material selected from the group of Ag, Ag alloy, Al, and Al alloy.

11. The organic light-emitting display apparatus as claimed in claim 9, wherein the protection layer has a stack structure in which a transparent conductive oxide, a semi-transmissive metal layer, and a transparent conductive oxide are sequentially stacked.

12. The organic light-emitting display apparatus as claimed in claim 1, wherein the protection layer is on the third conductive layer and protects the third conductive layer from external substances.

13. The organic light-emitting display apparatus as claimed in claim 1, wherein the active layer includes a semiconductor doped with ion impurities.

14. The organic light-emitting display apparatus as claimed in claim 13, wherein the semiconductor includes amorphous silicon or crystalline silicon.

15. An organic light-emitting display apparatus, comprising:

a thin film transistor (TFT) including a gate electrode, a source electrode, and a drain electrode;

a light-emitting region including a pixel electrode, an opposite electrode, and an organic emissive layer; and a pad region including a pad electrode and a protection layer formed on the pad electrode, wherein the pad electrode includes:

a first conductive layer on a first insulating layer, the first conductive layer being formed of a transparent conductive material;

a second conductive layer on the first conductive layer, the second conductive layer being formed of a metal; and a third conductive layer on the second conductive layer and connected to the first conductive layer, the third conductive layer being formed of a same material as the source electrode and the drain electrode of the TFT, wherein the protection layer has a stack structure in which a transparent conductive oxide, a semi-transmissive metal layer, and a transparent conductive oxide are sequentially stacked.

16. A method of manufacturing an organic light-emitting display apparatus, the method comprising:

a first mask operation in which an active layer is formed on a substrate;

a second mask operation in which a first insulating layer, a transparent conductive material, and a metal are sequentially stacked on the active layer, and the transparent conductive material and the metal are patterned at the same time to form a gate electrode of a thin film transistor, a first conductive layer including a transparent conductive material in a pad region, and a second conductive layer including a metal;

a third mask operation in which a second insulating layer is formed on a resultant product of the second mask operation, and the second insulating layer is patterned to form an opening that exposes source and drain regions of the active layer and the first conductive layer;

a fourth mask operation in which a metal layer is formed on a resultant product of the third mask operation, and the metal layer is patterned to form source and drain electrodes that contact the source and drain regions of the active layer and a third conductive layer that contacts the first conductive layer; and a fifth mask operation in which a transparent conductive oxide layer is formed on a resultant product of the fourth mask operation, and the transparent conductive oxide layer is patterned to form a protection layer on the third conductive layer.

17. The method as claimed in claim 16, wherein in the second mask operation, the second conductive layer is patterned such that a portion of the first conductive layer is exposed.

18. The method as claimed in claim 16, wherein in the third mask operation, the first conductive layer, the second conductive layer, and the first insulating layer disposed on the outer portion of the first conductive layer are patterned such that portions of the first conductive layer, the second conductive layer, and the first insulating layer are exposed.

19. The method as claimed in claim 16, wherein in the third mask operation, the first conductive layer and the second conductive layer are patterned such that portions of the first conductive layer and the second conductive layer are exposed.

20. The method as claimed in claim 16, wherein the protection layer has a stack structure in which an oxide, a semi-transmissive metal layer, and a transparent conductive oxide are sequentially stacked.

* * * * *